United States Patent
Tsai

(10) Patent No.: US 10,498,291 B2
(45) Date of Patent: Dec. 3, 2019

(54) BIAS CIRCUIT AND POWER AMPLIFIER CIRCUIT

(71) Applicant: Airoha Technology Corp., Hsinchu (TW)

(72) Inventor: Li-Fan Tsai, Kaohsiung (TW)

(73) Assignee: AIROHA TECHNOLOGY CORP., Hsinchu (TW)

( * ) Notice: Subject to any disclaimer, the term of this patent is extended or adjusted under 35 U.S.C. 154(b) by 0 days.

(21) Appl. No.: 16/027,633

(22) Filed: Jul. 5, 2018

(65) Prior Publication Data

US 2019/0068124 A1   Feb. 28, 2019

(30) Foreign Application Priority Data

Aug. 31, 2017   (TW) .............................. 106129822 A

(51) Int. Cl.
*H03F 1/02* (2006.01)
*H03F 3/21* (2006.01)
*H03F 3/193* (2006.01)

(52) U.S. Cl.
CPC ............. *H03F 1/0222* (2013.01); *H03F 3/21* (2013.01); *H03F 2200/105* (2013.01); *H03F 2200/21* (2013.01); *H03F 2200/216* (2013.01)

(58) Field of Classification Search
USPC ................. 330/285, 296, 277, 298
See application file for complete search history.

(56) References Cited

U.S. PATENT DOCUMENTS

| 6,922,107 | B1* | 7/2005 | Green ..................... H03F 1/302 330/285 |
| 7,365,604 | B2* | 4/2008 | Luo .......................... H03F 1/30 330/285 |
| 9,148,097 | B2 | 9/2015 | Ding et al. |
| 10,158,327 | B2* | 12/2018 | Kim ....................... H03F 1/0205 |
| 10,263,566 | B1* | 4/2019 | Laighton ............... H03F 1/0205 |

FOREIGN PATENT DOCUMENTS

TW   I509979 B   11/2015

OTHER PUBLICATIONS

TIPO Office Action dated May 3, 2018 in corresponding Taiwan application (No. 106129822).

* cited by examiner

*Primary Examiner* — Hieu P Nguyen
(74) *Attorney, Agent, or Firm* — McClure, Qualey & Rodack, LLP

(57) ABSTRACT

A bias circuit and a power amplifier circuit are provided in the present disclosure. The bias circuit includes an output node, a power detecting circuit, a first constant voltage bias circuit, and a constant current bias circuit. The output node is configured to provide a bias signal to a power amplifier unit. The output node is further configured to receive an input signal of the power amplifier unit. The power detecting circuit is configured to detect a power of the input signal of the power amplifier unit to provide a first control signal. The first constant voltage bias circuit is configured to selectively provide a first signal to the output node according to the first control signal. The constant current bias circuit provides a second signal to the output node.

10 Claims, 4 Drawing Sheets

BIAS CIRCUIT AND POWER AMPLIFIER CIRCUIT

This application claims the benefit of Taiwan application Serial No. 106129822, filed Aug. 31, 2017, the subject matter of which is incorporated herein by reference.

BACKGROUND OF THE PRESENT DISCLOSURE

Field of the Present Disclosure

The present disclosure relates in general to a bias circuit and a power amplifier circuit.

Description of the Related Art

A bias circuit normally provides a voltage signal or a current signal to an input node of a power amplifier circuit to be used as a bias signal of the power amplifier circuit. However, when the input signal of the power amplifier circuit is at a high-power state, the linearity of the power amplifier circuit will drop and the output signal will be distorted. Therefore, it has become a prominent task for the industries to provide a new bias circuit capable of providing compensation to avoid the linearity of the power amplifier circuit dropping when the input signal of the power amplifier circuit is at the high-power state.

SUMMARY OF THE PRESENT DISCLOSURE

According to one embodiment of the present disclosure, a bias circuit and a power amplifier circuit are provided. The bias circuit includes an output node, a power detecting circuit, a first constant voltage bias circuit and a constant current bias circuit. The output node is configured to provide a bias signal to a power amplifier unit and receive an input signal of the power amplifier unit. The power detecting circuit is configured to detect a power of the input signal of the power amplifier unit to provide a first control signal. The first constant voltage bias circuit is configured to selectively provide a first signal to the output node according to the first control signal. The constant current bias circuit is configured to provide a second signal to the output node. The power amplifier circuit includes the bias circuit and the power amplifier unit.

According to another embodiment of the present disclosure, a power amplifier circuit is provided. The power amplifier circuit includes a bias circuit and a power amplifier unit. The bias circuit includes an output node, a power detecting circuit, a first constant voltage bias circuit and a constant current bias circuit. The output node is configured to provide a bias signal to a power amplifier unit and receive an input signal of the power amplifier unit. The power detecting circuit is configured to detect a power of the input signal of the power amplifier unit to provide a first control signal. The first constant voltage bias circuit is configured to selectively provide a first signal to the output node according to the first control signal. The constant current bias circuit is configured to provide a second signal to the output node.

The above and other aspects of the present disclosure will become better understood with regard to the following detailed description of the preferred but non-limiting embodiment(s). The following description is made with reference to the accompanying drawings.

DETAILED DESCRIPTION OF THE PRESENT DISCLOSURE

Figure 1:
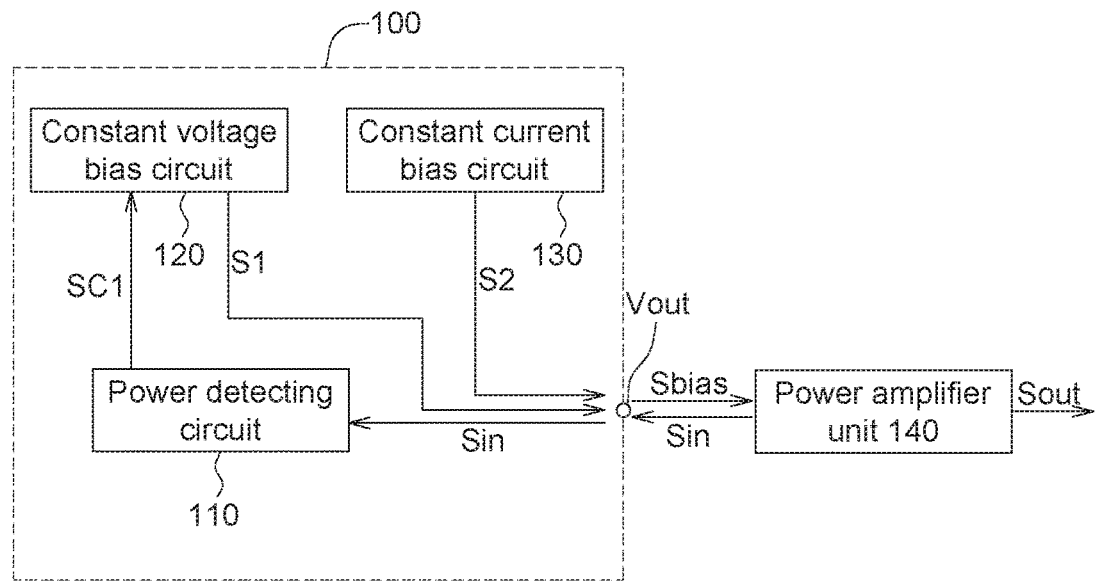
FIG. 1 shows a block diagram of a bias circuit 100 according to a first embodiment of the present disclosure.

FIG. 1 shows a block diagram of a bias circuit 100 according to a first embodiment of the present disclosure. The bias circuit 100 includes an output node Vout, a power detecting circuit 110, a constant voltage bias circuit 120, and a constant current bias circuit 130. The output node Vout is configured to provide a bias signal Sbias to a power amplifier unit 140 and receive an input signal Sin of the power amplifier unit 140. The power detecting circuit 110 detects a power of the input signal Sin of the power amplifier unit 140 to provide a control signal SC1. The constant voltage bias circuit 120 is configured to selectively provide a first signal S1 to the output node Vout according to control signal SC1. The constant current bias circuit 130 provides a second signal S2 to the output node Vout.

In the present disclosure, the power amplifier unit 140 generates an output signal Sout according to the input signal Sin, such as a radio frequency signal. The power detecting circuit 110 detects a power of the input signal Sin of the power amplifier unit 140. When the power detecting circuit 110 detects that the input signal Sin has a power larger than or equivalent to a first power value, the power detecting circuit 110 determines that the power of the input signal Sin is at a high-power state. Meanwhile, the power detecting circuit 110 provides a control signal SC1 of enabling level to the first constant voltage bias circuit 120 and makes the constant voltage bias circuit 120 provide a first signal S1 to the output node Vout to compensate the power amplifier unit 140. That is, when the power of the input signal Sin is at the high-power state, the first signal S1 and the second signal S2 are used as bias signals Sbias provided to the power amplifier unit 140.

Figure 2:
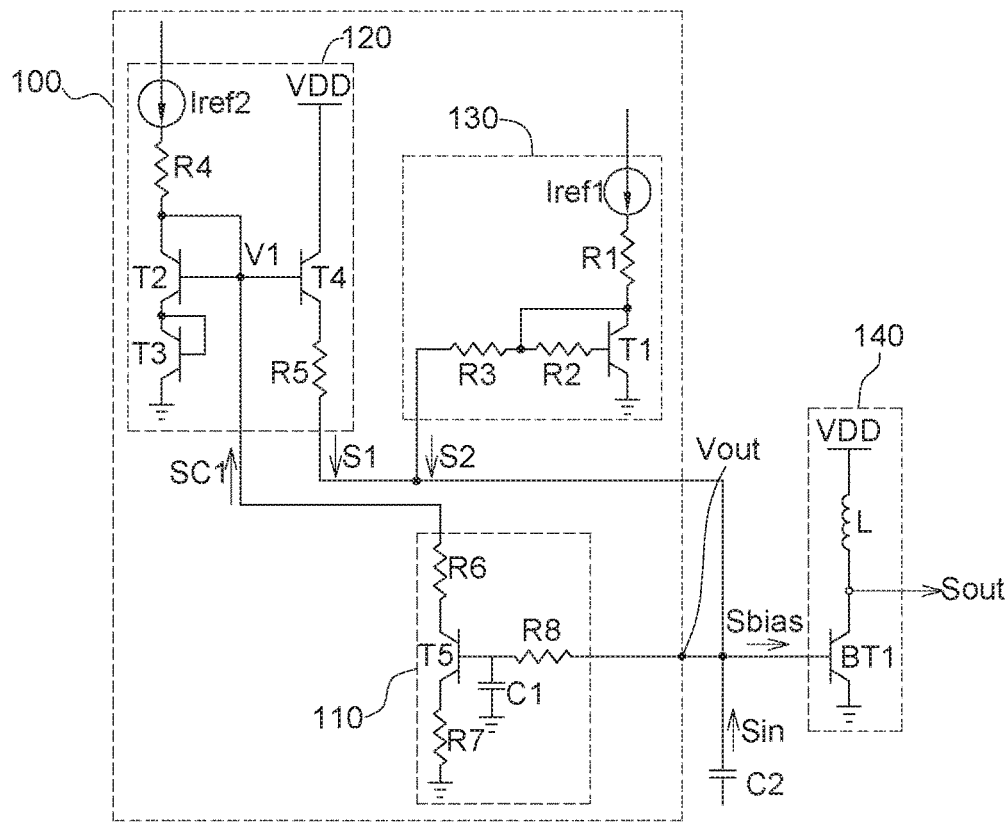
FIG. 2 shows a circuit diagram of a bias circuit 100 according to a first embodiment of the present disclosure.

On the other hand, when the power detecting circuit 110 detects that the input signal Sin has a power smaller than the first power value, the power detecting circuit 110 determines that the power of the input signal Sin is at a low-power state. Meanwhile, the power detecting circuit 110 provides a control signal SC1 of non-enabling level to constant voltage bias circuit 120 and makes constant voltage bias circuit 120 unable to provide the first signal S1 to the output node Vout. That is, when the power of the input signal Sin is at the low-power state, there is no need to compensate the power amplifier unit, and the second signal S2 is used as a bias signal Sbias provided to the power amplifier unit 140. In an embodiment, the first power value can be adjusted according to actual needs. In an embodiment, the bias circuit 100 and the power amplifier unit 140 can be combined to form a power amplifier circuit, FIG. 2 shows a circuit diagram of a bias circuit 100 according to a first embodiment of the present disclosure. In the present embodiment, the constant current bias circuit 130 includes a current source Iref1, a transistor T1, and resistors R1 to R3. The current source Iref1 is configured to provide a reference current. The transistor T1 has a second node coupled to a ground node. The resistor R1 is coupled between the current source Iref1 and a first node of the transistor T1. The resistor R2 is coupled between the first node of the transistor T1 and a control node of the transistor T1. The resistor R3 is coupled between the first node of the transistor T1 and the output node Vout of the bias circuit 100. In the present embodiment, the transistor T1 is realized by an NPN-type bipolar transistor; the control node of the transistor T1 is realized by a base node; the first node of the transistor T1 is realized by a collector node; the second node of the transistor T1 is realized by an emitter node. However, the present disclosure is not limited to the circuit structure as indicated in FIG. 2, and the constant current bias circuit 130 can be realized by other circuit elements capable of providing a constant current signal to the power amplifier unit 140.

In the present embodiment, the power amplifier unit 140 includes a bipolar transistor BT1 and an inductor L. The bipolar transistor BT1 has a base node, coupled to the output node Vout of the bias circuit 100 and configured to receive an input signal Sin through a capacitor C2, and a collector node configure to output an output signal Sout.

In the present embodiment, the constant current bias circuit 130 and the power amplifier unit 140 form a current mirror circuit. That is, the constant current bias circuit 130 is configured to provide a second signal S2 to the power amplifier unit 140. The second signal S2 is a constant current signal provided by the current source Iref1. The constant current bias circuit 130 limits the conducting current of the bipolar transistor BT1 of the power amplifier unit 140.

In the present embodiment, the constant voltage bias circuit 120 includes a current source Iref2, transistors T2 to T4, and resistors R4 to R5. The current source Iref2 is configured to provide a reference current. The transistor T2 has a first node coupled to a control node of the transistor T2, The resistor R4 is coupled between the current source Iref2 and the first node of the transistor T2. The transistor T3 has a first node, coupled to a control node of the transistor T3 and a second node of the transistor T2, and a second node coupled to a ground node. The transistor T4 has a first node, coupled to a first bias VDD, and a control node coupled to the control node of the transistor T2. The resistor R5 is coupled between a second node of the transistor T4 and the output node Vout of the bias circuit 100. In the present embodiment, the transistors T2 to T4 are realized by NPN-type bipolar transistors; the control node of the transistors T2 to T4 are realized by a base node; the first node of the transistors T2 to T4 are realized by a collector node; the second node of the transistors T2 to T4 are realized by an emitter node. However, the present disclosure is not limited to the circuit structure as indicated in FIG. 2, the constant voltage bias circuit 120 can be realized by is other circuit elements capable of providing a constant voltage signal to the power amplifier unit 140. In the present embodiment, the constant voltage bias circuit 120 is configured to provide the first signal S1 to the power amplifier unit 140. Since the transistors T2 and T3 are conducted and used as a diode, the voltage of the node V1 is a constant value, and the voltages of the two ends of the transistor T4 also are constant values. Thus, the first signal S1 is a constant voltage signal. The constant voltage signal also provides a current to the poweramplifier unit 140.

In the present embodiment, the power detecting circuit 110 includes a transistor T5, resistors R6 to R8, and a capacitor C1. The resistor R6 is coupled between a first node of the transistor T5 and the control node of the transistor T2. The resistor R7 is coupled between a second node of the transistor T5 and a ground node. The capacitor C1 is coupled between a control node of the transistor T5 and the ground node. The resistor R8 is coupled between the control node of the transistor T5 and the output node Vout of the bias circuit 100. In the present embodiment, the power detecting circuit 110 detects the power of the input signal Sin of the power amplifier unit 140 to determine whether the power of the input signal Sin is at a high-power state or a low-power state. When the power of the input signal Sin is at the high-power state, the power detecting circuit 110 provides a control signal SC1 to the constant voltage bias circuit 120 and makes the constant voltage bias circuit 120 provide a current signal to the power amplifier unit 140 to compensate the influence caused by the drop in the linearity of the power amplifier unit 140. In the present embodiment, the power detecting circuit 110 detects the voltage level of the input signal Sin of the power amplifier unit 140. However, the present disclosure is not limited to the circuit structure as indicated in FIG. 2. The power detecting circuit 110 can be realized by other circuit elements capable of detecting the power of the input signal Sin of the power amplifier unit 140 to determine whether the above compensation is needed.

Figure 3A:
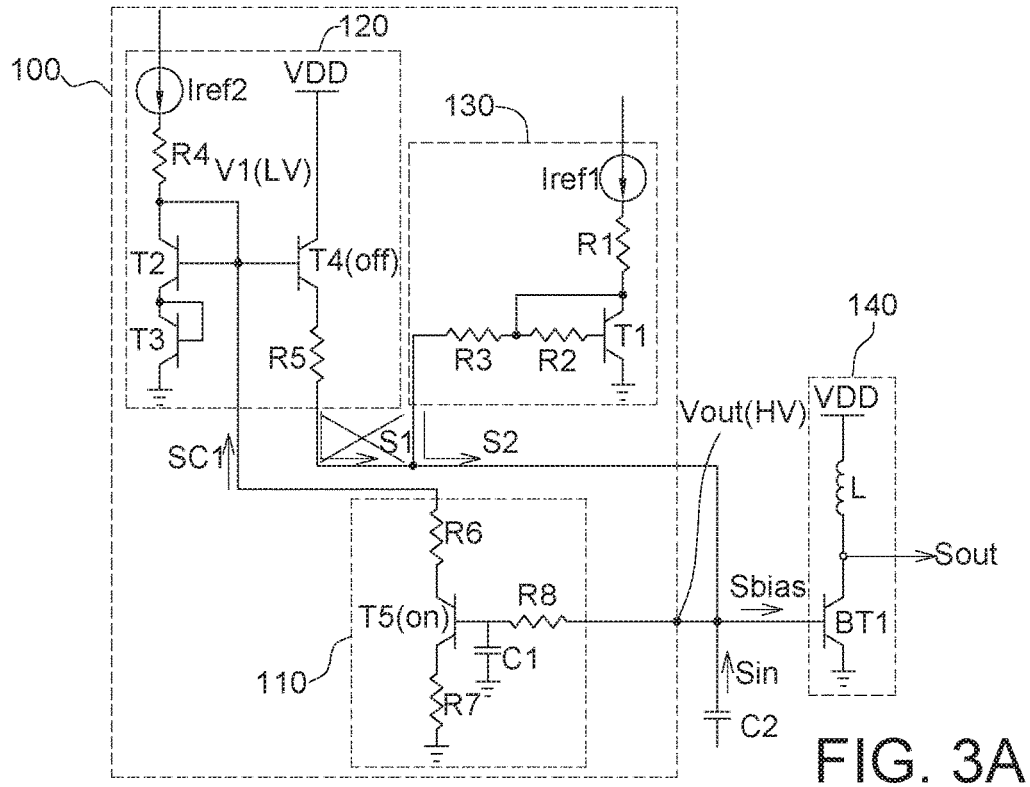
FIG. 3A shows a schematic diagram of the bias circuit 100 when the input signal Sin of the power amplifier unit 140 is at a low-power state.
Figure 3B:
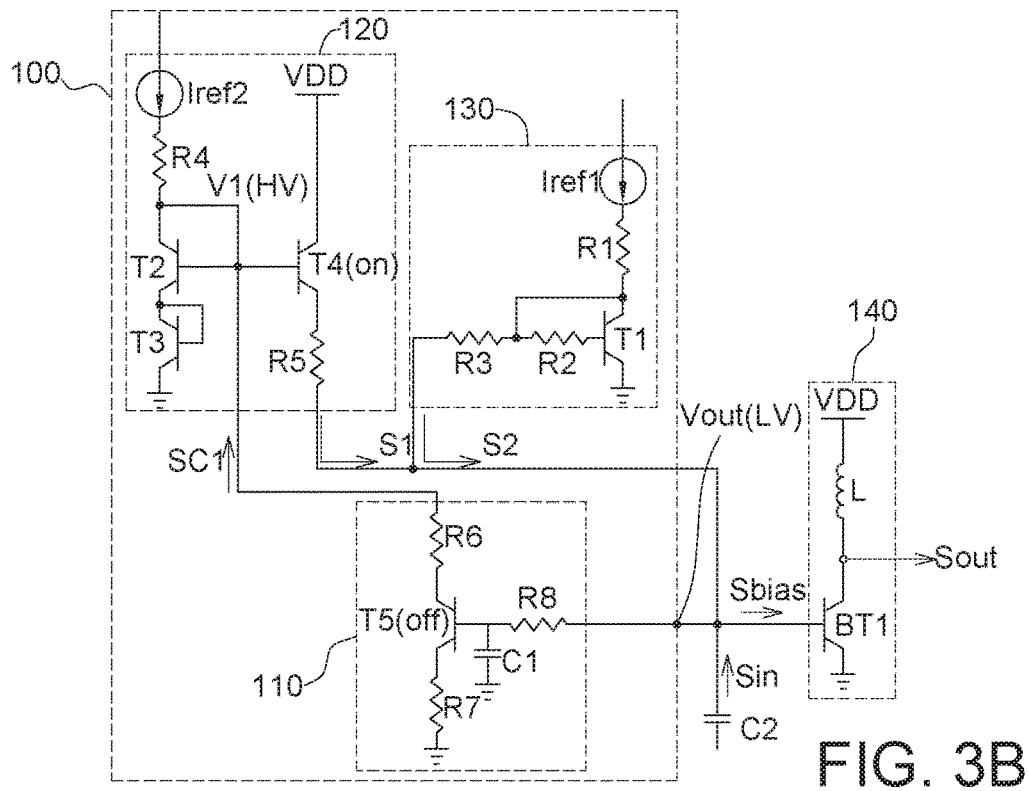
FIG. 3B shows a schematic diagram of the bias circuit 100 when the input signal Sin of the power amplifier unit 140 is at a high-power state.

FIG. 3A and FIG. 3B describe the control operation of the power detecting circuit 110. FIG. 3A shows a schematic diagram of the bias circuit 100 when the input signal Sin of the power amplifier unit 140 has a power smaller than a first power value (that is, when the input signal Sin of the power amplifier unit 140 is at a low-power state). Meanwhile, as indicated in FIG. 3A, given that the output node Vout has a high voltage (designated as Vout(HV)), the transistor T5 of the power detecting circuit 110 is therefore conducted (designated as T5(on)) when the input signal Sin is at the low-power state. Since the transistor T5 is conducted, the node V1 is coupled to the ground node through the resistor R6, the transistor T5, and the resistor R7, and therefore has a low voltage (designated as V1(LV)). Since the node V1 has a low voltage, the transistor T4 is turned off (designated by T4(off)) and makes the constant voltage bias circuit 120 unable to provide the first signal S1 to the power amplifier unit 140. That is, when the power of the input signal Sin is at the low-power state, there is no need to provide compensation to the power amplifier unit, and the second signal S2 is used as a bias signal Sbias provided to the power amplifier unit 140.

Figure 4A:
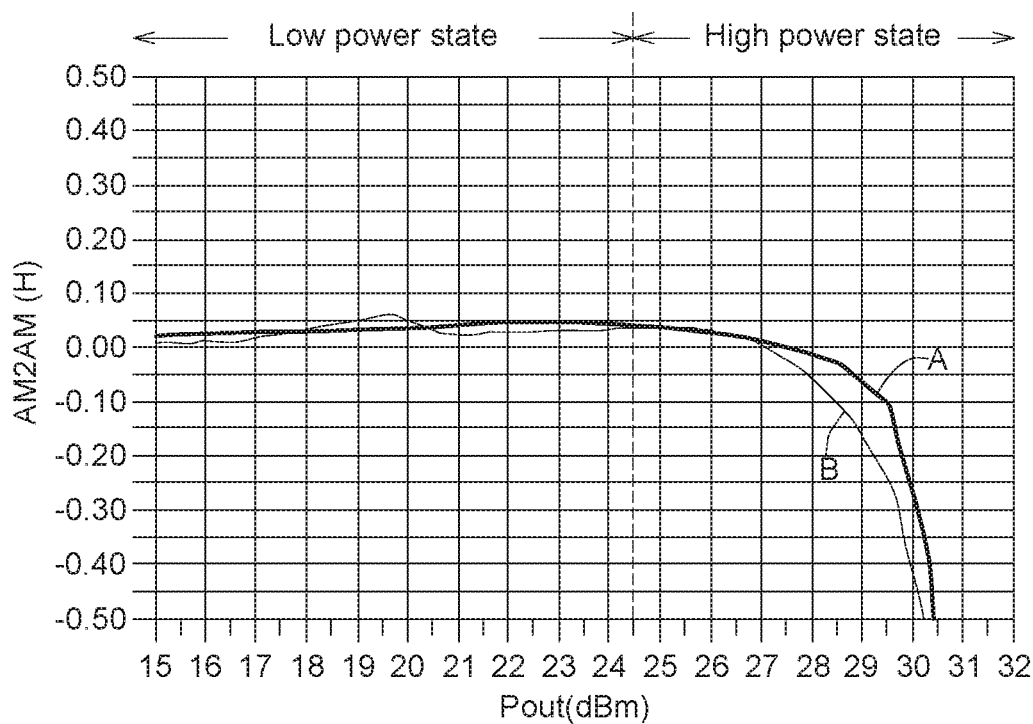
FIG. 4A and FIG. 4B show linearity curves of power amplifier obtained when the bias circuit 100 of the present disclosure and the bias circuit 100 of a conventional bias circuit are respectively used.
Figure 4B:
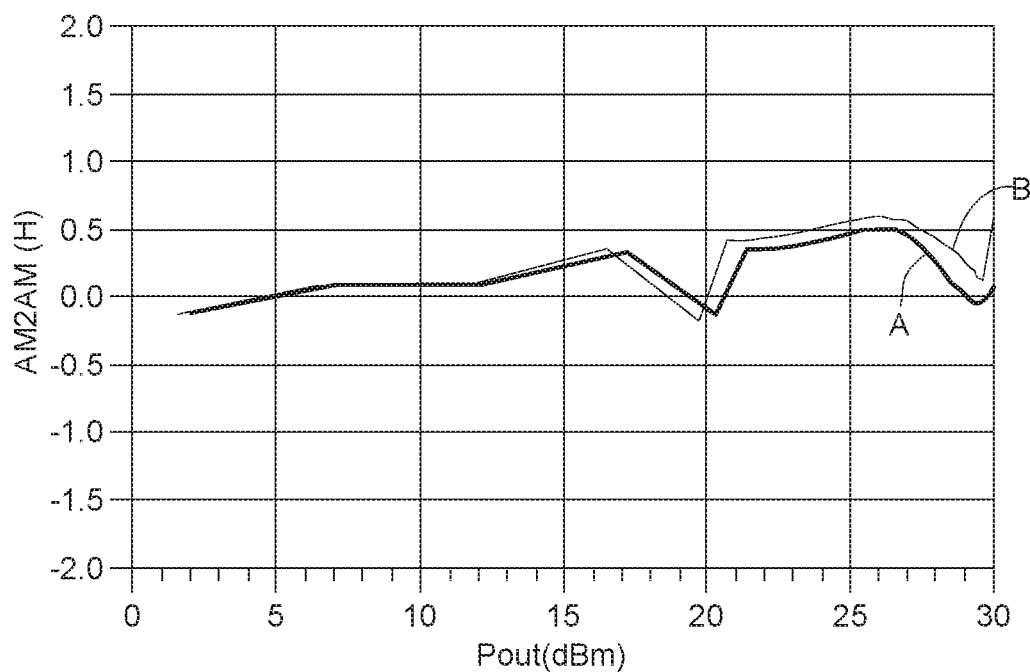

On the other hand, FIG. 3B shows a schematic diagram of the bias circuit 100 when the input signal Sin of the power amplifier unit 140 has a power larger than or equivalent to the first power value (that is, when the input signal Sin of the power amplifier unit 140 is at a high-power state). Meanwhile, as indicated in FIG. 3B, given that the voltage of the output node Vout drops to a low voltage (LV) due to the drop of the linearity, the transistor T5 of the power detecting circuit 110 is therefore turned off (designated as T5(off)) when the input signal Sin is at a high-power state. Since the transistor T5 is turned off, the node VI is not connected to the ground node and still remains at a high voltage (HV). Since the node V1 has a high voltage, the transistor T4 is conducted (designated as T4 (on)) and makes the constant voltage bias circuit 120 provide the first signal S1 to the power amplifier unit 140. That is, when the power of the input signal Sin is at the high-power state, the first signal S1 and the second signal S2 are used as bias signals Sbias for compensating the power amplifier unit, FIG. 4A and FIG. 4B show linearity curves of power amplifier obtained when the bias circuit 100 of the present disclosure and the bias circuit 100 of a conventional bias circuit are respectively used. The linearity of the power amplifier is normally represented by the distortion of the amplitude of an input signal with respect to the amplitude of an output signal (AM-AM) and the distortion of the amplitude of the input signal with respect to the phase difference (AM-PM). As indicated in FIG. 4A and FIG. 4B, the linearity characteristic curve of power amplifier obtained when the bias circuit 100 of the present disclosure is used is designated by A, and the linearity characteristic curve of power amplifier obtained when the bias circuit 100 of a conventional bias circuit is used is designated by B. FIG. 4A shows that, at the high power state, although the linearity of power amplifier obtained when the bias circuit 100 of the present disclosure is used drops, the drop in the characteristic curve A is less and slower than that in the characteristic curve B. FIG. 4B shows that, at the high power state, the characteristic curve A is closer to 0 than the characteristic curve B. That is, the bias circuit 100 of the present disclosure resolves the problem of linearity drop occurring when the power amplifier is at the high power state, and therefore avoids signal distortion.

Figure 5:
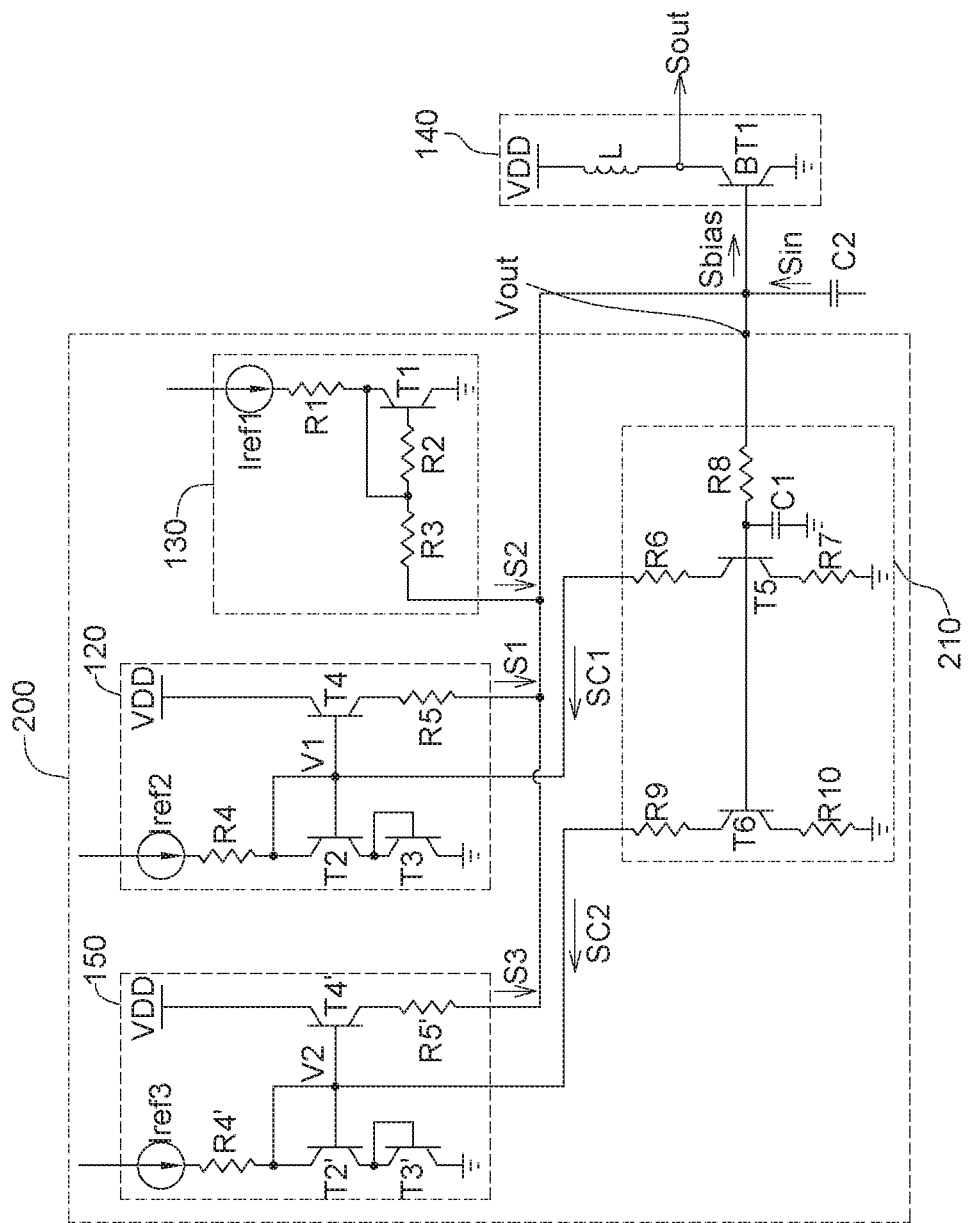
FIG. 5 shows a circuit diagram of a bias circuit 200 according to a second embodiment of the present disclosure.

FIG. 5 shows a circuit diagram of a bias circuit 200 according to a second embodiment of the present disclosure. The bias circuit 200 of FIG. 5 is different from the bias circuit 100 of FIG. 2 in that the bias circuit 200 further includes another constant voltage bias circuit 150. The circuit structure of the constant voltage bias circuit 150 is identical to the circuit structure of the constant voltage bias circuit 120, and the similarities are not repeated here. In the present embodiment, the power detecting circuit 210 of FIG. 5 further provides a control signal SC2 to the constant voltage bias circuit 150 according to the power of the input signal Sin of the power amplifier unit 140 and makes the constant voltage bias circuit 150 selectively provide a third signal S3 to the output node Vout of the bias circuit 200 according to the control signal 502.

In the present embodiment, the power detecting circuit 210 of FIG. 5 is different from the power detecting circuit 110 of FIG. 2 in that the power detecting circuit 210 further includes a transistor T6 and resistors R9 to R10. The transistor T6 has a control node coupled to the control node of the transistor T5. The resistor R9 is coupled between a first node of the transistor T6 and the control node of the transistor T2. The resistor R10 is coupled between a second node of the transistor R6 and a ground node. In the present embodiment, the power detecting circuit 210 detects the power of the input signal Sin of the power amplifier unit 140 to determine whether the power of the input signal Sin is at a high-power state or a low-power state. When the power of the input signal Sin is at the high-power state, the power detecting circuit 210 provides a control signal SC1 to the constant voltage bias circuit 120 and makes the constant voltage bias circuit 120 provide a first signal S1 to the power amplifier unit 140. The power detecting circuit 210 further provides a control signal SC2 to the constant voltage bias circuit 150 and makes the constant voltage bias circuit 150 provide a third signal S3 to the power amplifier unit 140. That is, when the power of the input signal Sin is at the high-power state, the first signal S1, the second signal S2 and the third signal S3 are used as bias signals Sbias for compensating the influence caused by the drop in the linearity of the power amplifier unit 140. In an embodiment, the bias circuit 200 and the power amplifier unit 140 can be combined to form a power amplifier circuit.

However, the present disclosure is not limited thereto. In another embodiment, the user can design the circuit structure of the power detecting circuit according to actual needs such that the power detecting circuit can divide the input signal of the power amplifier unit 140 into more levels of power states in response to different magnitudes of currents of the signal used to compensate the power amplifier. For example, when the power detecting circuit detects that the power of the input signal Sin is smaller than a first power value (the low-power state), the constant current bias circuit 130 is turned on, and the second signal S2 is used as a bias signal Sbias provided to the power amplifier unit 140. Then, the constant voltage bias circuit 120 is turned on only when the power detecting circuit detects that the power of the input signal Sin is larger than or equivalent to the first power value (the high-power state), and the first signal S1 and the second signal S2 are used as bias signals Sbias provided to the power amplifier unit 140. When the power detecting circuit detects that the power of the input signal Sin is larger than or equivalent to a second power value, the constant voltage bias circuit 150 is turned on only when the second power value is larger than the first power value (that is, the power of the input signal Sin is at a higher power state), and the first signal S1, the second signal S2 and the third signal S3 are used as bias signals Sbias provided to the power amplifier unit 140.

Many types of bias circuits and power amplifier circuits are disclosed in above embodiments. By detecting the power of the power amplifier unit 140, the constant voltage bias circuit selectively provides a signal to the output node of the bias circuit to be used as a bias signal Sbias of the power amplifier unit 140 to compensate the influence caused by the drop in the linearity of the power amplifier unit when the power amplifier unit is at the high-power state and therefore avoid the amplified input signal Sin being distorted.

While the present disclosure has been described by way of example and in terms of the preferred embodiment(s), it is to be understood that the present disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A bias circuit, comprising:
   an output node configured to provide a bias signal to a power amplifier unit and receive an input signal of the power amplifier unit;
   a power detecting circuit configured to detect a power of the input signal of the power amplifier unit to provide a first control signal;
   a first constant voltage bias circuit configured to selectively provide a first signal to the output node according to the first control signal; and
   a constant current bias circuit configured to provide a second signal to the output node;
   wherein the constant current bias circuit comprises:
   a first current source configured to provide a first reference current;
   a first transistor having a second node coupled to a ground node;
   a first resistor coupled between the first current source and a first node of the first transistor; and
   a second resistor coupled between the first node of the first transistor and a control node of the first transistor.

2. The bias circuit according to claim 1, wherein when the power detecting circuit detects that the power of the input signal is larger than or equivalent to a first power value, the first control signal is an enabling signal and makes the first constant voltage bias circuit to provide the first signal to the output node.

3. The bias circuit according to claim 2, wherein when the power detecting circuit detects that the power of the input signal is smaller than the first power value, the first control signal is a non-enabling signal and makes the first constant voltage bias circuit unable to provide the first signal to the output node.

4. The bias circuit according to claim 3, wherein the constant current bias circuit further comprises:
   a third resistor coupled between the first node of the first transistor and the output node.

5. The bias circuit according to claim 4, wherein the first constant voltage bias circuit comprises:
   a second current source configured to provide a second reference current;
   a second transistor having a first node coupled to a control node of the second transistor;
   a fourth resistor coupled between the second current source and a first node of the second transistor;
   a third transistor, wherein a first node of the third transistor is coupled to a control node of the third transistor and a second node of the second transistor, and a second node of the third transistor is coupled to the ground node;
   a fourth transistor, wherein a first node of the fourth transistor is coupled to a first bias and a control node of the fourth transistor is coupled to the control node of the second transistor; and
   a fifth resistor coupled between a second node of the fourth transistor and the output node.

6. The bias circuit according to claim 5, wherein the power detecting circuit comprises:
   a fifth transistor;
   a sixth resistor coupled between a first node of the fifth transistor and the control node of the second transistor;
   a seventh resistor coupled between a second node of the fifth transistor and the ground node;
   a first capacitor coupled between a control node of the fifth transistor and the ground node; and
   an eighth resistor coupled between the control node of the fifth transistor and the output node.

7. The bias circuit according to claim 6, further comprising:
   a second constant voltage bias circuit configured to selectively provide a third signal to the output node according to a second control signal, wherein the second control signal is generated by the power detecting circuit according to the power of the input signal of the power amplifier unit;
   wherein when the power detecting circuit detects that the power of the input signal is larger than or equivalent to the first power value, the second control signal is an enabling signal and makes the second constant voltage bias circuit to provide the third signal to the output node.

8. The bias circuit according to claim 7, wherein the power detecting circuit further comprises:
   a sixth transistor, wherein a control node of the sixth transistor is coupled to the control node of the fifth transistor;
   a ninth resistor coupled between a first node of the sixth transistor and the control node of the second transistor; and
   a tenth resistor coupled between a second node of the sixth transistor and the ground node.

9. The bias circuit according to claim 6, further comprising:
   a second constant voltage bias circuit configured to selectively provide a third signal to the power amplifier unit according to a second control signal, wherein the second control signal is generated by the power detecting circuit according to the power of the input signal of the power amplifier unit;
   wherein when the power detecting circuit detects that the power of the input signal is larger than or equivalent to a second power value, the second control signal is an enabling signal and makes the second constant voltage bias circuit to provide the third signal to the output node, and the second power value is larger than the first power value.

10. A power amplifier circuit, comprising:
   the bias circuit according to claim 1;
   wherein the power amplifier unit comprises:
   a bipolar transistor, wherein a base node of the bipolar transistor is coupled to the output node and configured to receive the input signal through a second capacitor, and a collector node of the bipolar transistor is configured to output an output signal; and
   an inductor coupled to the collector node of the bipolar transistor.

* * * * *